(12) United States Patent
Stroud et al.

(10) Patent No.: US 10,547,312 B2
(45) Date of Patent: Jan. 28, 2020

(54) WIDE VOLTAGE RANGE INPUT INTERFACE

(71) Applicant: Silicon Laboratories Inc., Austin, TX (US)

(72) Inventors: Ernest T. Stroud, Austin, TX (US); Stefan N. Mastovich, Round Rock, TX (US)

(73) Assignee: Silicon Laboratories Inc., Austin, TX (US)

( * ) Notice: Subject to any disclaimer, the term of this patent is extended or adjusted under 35 U.S.C. 154(b) by 254 days.

(21) Appl. No.: 15/459,226

(22) Filed: Mar. 15, 2017

(65) Prior Publication Data
US 2018/0269877 A1 Sep. 20, 2018

(51) Int. Cl.
| | | |
|---|---|---|
| *H03K 19/0185* | (2006.01) | |
| *H01L 27/02* | (2006.01) | |
| *H02M 3/07* | (2006.01) | |
| *H03K 3/011* | (2006.01) | |
| *H03K 5/08* | (2006.01) | |
| *H03K 5/24* | (2006.01) | |

(52) U.S. Cl.
CPC . *H03K 19/018507* (2013.01); *H01L 27/0251* (2013.01); *H01L 27/0266* (2013.01); *H02M 3/07* (2013.01); *H03K 3/011* (2013.01); *H03K 5/08* (2013.01); *H03K 5/24* (2013.01)

(58) Field of Classification Search
CPC .................. H01L 27/0281; H01L 27/0285
USPC .......................................................... 361/56
See application file for complete search history.

(56) References Cited

U.S. PATENT DOCUMENTS

| | | | | |
|---|---|---|---|---|
| 5,333,093 A | * | 7/1994 | Krautschneider .. | H03K 17/0822 327/309 |
| 5,793,592 A | * | 8/1998 | Adams ................. | H03K 17/162 361/111 |
| 6,628,159 B2 | * | 9/2003 | Voldman ............. | H01L 27/1203 257/E27.112 |
| 7,855,862 B1 | * | 12/2010 | Gallagher ........... | H01L 27/0266 361/56 |

(Continued)

OTHER PUBLICATIONS

Silicon Laboratories, "Si827x Isolated Gate Drivers," downloaded Mar. 2017 from http://www.silabs.com/products/isolation/isolated-gate-drivers/si827x-isolated-gate-drivers, 6 pages.

*Primary Examiner* — Dharti H Patel
(74) *Attorney, Agent, or Firm* — Zagorin Cave LLP

(57) ABSTRACT

An integrated circuit includes an input terminal configured to receive an input signal, a reference voltage node configured to provide a control voltage, and a pass transistor comprising a first terminal coupled to a first node, a control terminal coupled to the reference voltage node, and a second terminal coupled to the input terminal. The control voltage has a control voltage level sufficient to allow a signal to pass from the second terminal to the first terminal. The pass transistor is configured to linearly transfer the input signal to the first node in response to a voltage level of the input signal being below a first voltage level and configured to transfer a voltage-limited version of the input signal to the first node in response to the voltage level being above the first voltage level. At most, a negligible DC current flows through the input terminal into the second terminal.

18 Claims, 3 Drawing Sheets

(56) References Cited

U.S. PATENT DOCUMENTS

| | | | |
|---|---|---|---|
| 7,924,540 B2* | 4/2011 | Tamegai | H02J 7/0029 |
| | | | 307/127 |
| 7,978,450 B1* | 7/2011 | Perisetty | H02H 9/046 |
| | | | 361/118 |
| 8,519,771 B1* | 8/2013 | Cical | H03K 17/687 |
| | | | 327/108 |
| 9,548,609 B2* | 1/2017 | Tsurui | H02H 9/046 |
| 2002/0071230 A1* | 6/2002 | Colclaser | H01L 27/0266 |
| | | | 361/56 |
| 2014/0376134 A1* | 12/2014 | Hunter | H02H 9/046 |
| | | | 361/56 |

* cited by examiner

WIDE VOLTAGE RANGE INPUT INTERFACE

BACKGROUND

Field of the Invention

This invention relates to integrated circuits and more particularly to integrated circuits providing an interface to a load.

Description of the Related Art

Providing an integrated circuit interface capable of properly receiving signals from either an analog controller or a digital controller requires the capability to handle a wide range of input voltage levels. For example, a conventional digital controller drives signals having high voltage levels as low as 2.5 V. However, a conventional analog controller outputs a signal having high voltage levels of at least 20 V. Such large signals can damage typical integrated circuit devices. Accordingly, techniques for providing an interface capable of receiving and handling signals that may have a wide range of voltage levels are desired.

SUMMARY OF EMBODIMENTS OF THE INVENTION

An integrated circuit includes an input terminal configured to receive an input signal, a reference voltage node configured to provide a control voltage, and a pass transistor comprising a first terminal coupled to a first node, a control terminal coupled to the reference voltage node, and a second terminal coupled to the input terminal. The control voltage has a control voltage level sufficient to allow a signal to pass from the second terminal to the first terminal. The pass transistor is configured to linearly transfer the input signal to the first node in response to a voltage level of the input signal being below a first voltage level and configured to transfer a voltage-limited version of the input signal to the first node in response to the voltage level being above the first voltage level. The pass transistor may be a laterally diffused metal-oxide-semiconductor field-effect transistor (MOSFET) having a high drain-to-source breakdown voltage. The first terminal may be a source terminal, the second terminal may be a drain terminal, and the control terminal may be a gate terminal. The pass transistor may be a field-effect transistor, the first terminal may be a source terminal, the second terminal may be a drain terminal, and the control terminal may be a gate terminal. The input signal being below the first voltage level may cause a drain-to-source voltage of the pass transistor to be less than a difference between a gate-to-source voltage of the pass transistor and a threshold voltage of the pass transistor and the input signal being above the first voltage level may cause the drain-to-source voltage of the pass transistor to be greater than the difference between the gate-to-source voltage of the pass transistor and the threshold voltage of the pass transistor. The pass transistor may provide a capacitive load to the input terminal. In operation, at most, a negligible DC current flows through the input terminal into the second terminal.

The integrated circuit may include electrostatic discharge protection circuitry coupled to the input terminal and the second terminal. The input terminal may include a pad structure. The input signal may be a digital signal having voltage levels in a range of 0 V to 2 V and a second voltage level on the first node may be at most a difference between the control voltage and a threshold voltage of the pass transistor, the pass transistor being a field effect transistor, the first terminal being a source terminal, the second terminal being a drain terminal, and the control terminal being a gate terminal. The input signal may be an analog signal having voltage levels in a range of 0 V to at least 10 V and a second voltage level on the first node may be at most a difference between the control voltage and a threshold voltage of the pass transistor, the pass transistor being a field effect transistor, the first terminal being a source terminal, the second terminal being a drain terminal, and the control terminal being a gate terminal. A signal on the first node may have a peak voltage level that is at least an order of magnitude less than a maximum allowable voltage level on the input terminal and the control voltage may have a control voltage level that is at least an order of magnitude less than the maximum allowable voltage level on the input terminal. The integrated circuit may include a clamp circuit configured to limit a second voltage level of a signal on the first node. The integrated circuit may include a comparator circuit configured to provide an output signal having a third voltage level in response to the second voltage level being greater than a predetermined voltage level and configured to provide the output signal having a fourth level in response to the second voltage level of the signal being less than the predetermined voltage level. The second voltage level may be an order of magnitude less than a maximum allowable voltage level of the input signal. The integrated circuit may include a reference voltage generator configured to generate a first reference voltage having a first DC voltage level that is substantially insensitive to process, power supply voltage, and temperature variations. The integrated circuit may include a charge pump configured to boost the first DC reference voltage to generate the control voltage having a substantially stable DC voltage level that is substantially insensitive to process, power supply voltage, and temperature variations.

In at least one embodiment, a method for receiving an input signal by an integrated circuit includes establishing a conductive path between a drain terminal of a pass transistor and a source terminal of the pass transistor by applying a control voltage to a gate terminal of the pass transistor. The method includes linearly transferring the input signal from an input terminal of the integrated circuit to a first node through the conductive path in response to a voltage level of the input signal being below a first voltage level and transferring a voltage-limited version of the input signal to the first node through the conductive path in response to the voltage level being above the first voltage level. The pass transistor may provide a capacitive load to the input terminal. In operation, at most a negligible DC current flows through the input terminal into the second terminal. The pass transistor may be a laterally diffused MOSFET having a high drain-to-source breakdown voltage and the first terminal may be a source terminal, the second terminal may be a drain terminal, and the control terminal may a gate terminal. The method may include receiving as the input signal, a digital signal having voltage levels in a range of 0 V to 2 V and a second voltage level on the first node may be at most a difference between the control voltage and a threshold voltage of the pass transistor, the pass transistor being a field effect transistor, the first terminal being a source terminal, the second terminal being a drain terminal, and the control terminal being a gate terminal. The method may include receiving as the input signal, an analog signal having voltage levels in a range of 0 V to at least 10 V and a second voltage level on the first node may be at most a difference between the control voltage and a threshold voltage of the pass transistor, the pass transistor being a field effect transistor, the first terminal being a source terminal, the second terminal being a drain terminal, and the control terminal being a gate terminal. A signal on the first node may have a peak voltage level that is at least an order of magnitude less than a maximum allowable voltage level on the input terminal and the control voltage may have a control voltage level that is at least an order of magnitude less than the maximum allowable voltage level on the input terminal. The method may include limiting a second voltage level of a signal on the first node. The method may include providing an output signal having a third voltage level in response to the second voltage level being greater than a predetermined voltage level and configured to provide the output signal having a fourth level in response to the second voltage level of the signal being less than the predetermined voltage level.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

An integrated circuit interface limits the voltage level of a received signal presented to internal circuitry and maintains a maximum voltage of the received signal substantially below voltage levels harmful to the internal circuitry. The integrated circuit interface presents a predominantly capacitive load at the input terminal and does not require a driving integrated circuit to provide any substantial DC current. The integrated circuit interface reduces a bill of materials in control applications and has reduced power consumption as compared to conventional integrated circuit interfaces.

Figure 1:
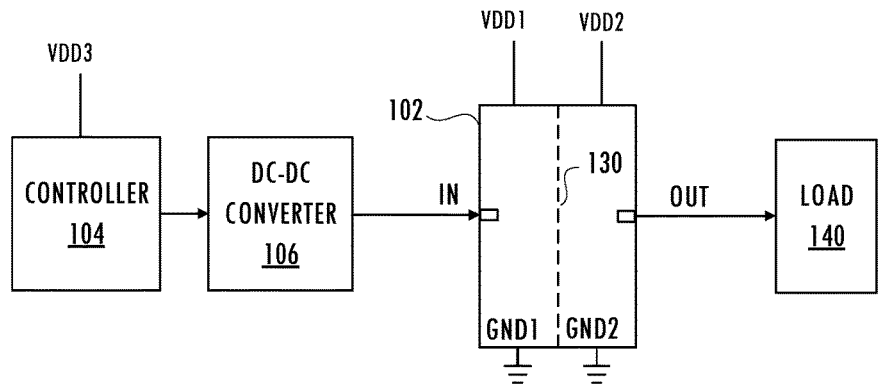
FIG. 1 illustrates an exemplary control system including a DC-DC converter coupled to a load via an isolated driver integrated circuit.

Referring to FIG. 1, in a conventional control application, isolation driver 102 receives input signal IN of a first voltage domain (i.e., VDD1, e.g., 3.2 V) from DC-DC converter 106 based on a signal received from controller 104 of a second voltage domain (i.e., VDD3, e.g., 5 V). Isolation driver 102 provides one or more output signals to load 140 operating in a third voltage domain (i.e., VDD2, e.g., hundreds of volts). Isolation driver 102 includes isolation barrier and a communication channel for safely communicating control signals from controller 104 across isolation channel 130 to drive load 140.

Figure 2:
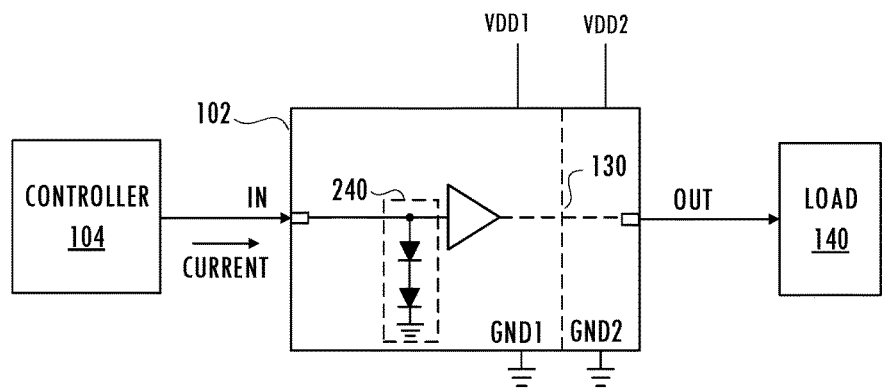
FIG. 2 illustrates an exemplary control system including an isolated driver integrated circuit incorporating a DC-DC converter.

Referring to FIG. 2, in at least some embodiments, isolation driver 102 includes integrated voltage regulation and control. By integrating voltage regulation and functions of DC-to-DC converter 106 into isolation driver 102, fewer external elements are required by a control system, isolation driver 102 may use less printed circuit board routing, and the control system of FIG. 2 has a reduced bill of materials, as compared to the control system of FIG. 1. Isolation driver 102 implements a technique for handling a wide range of voltage levels at the input terminal that uses clamp circuit 240. Clamp circuit 240 sinks DC current from controller 104 to limit the voltage presented to internal circuitry including devices having breakdown voltages substantially less than expected input voltage levels. However, the voltage clamp technique consumes a substantial amount of power and imposes a required drive capability on controller 104 due to input current levels e.g., input currents on the order of tens of milliamps.

Figure 3:
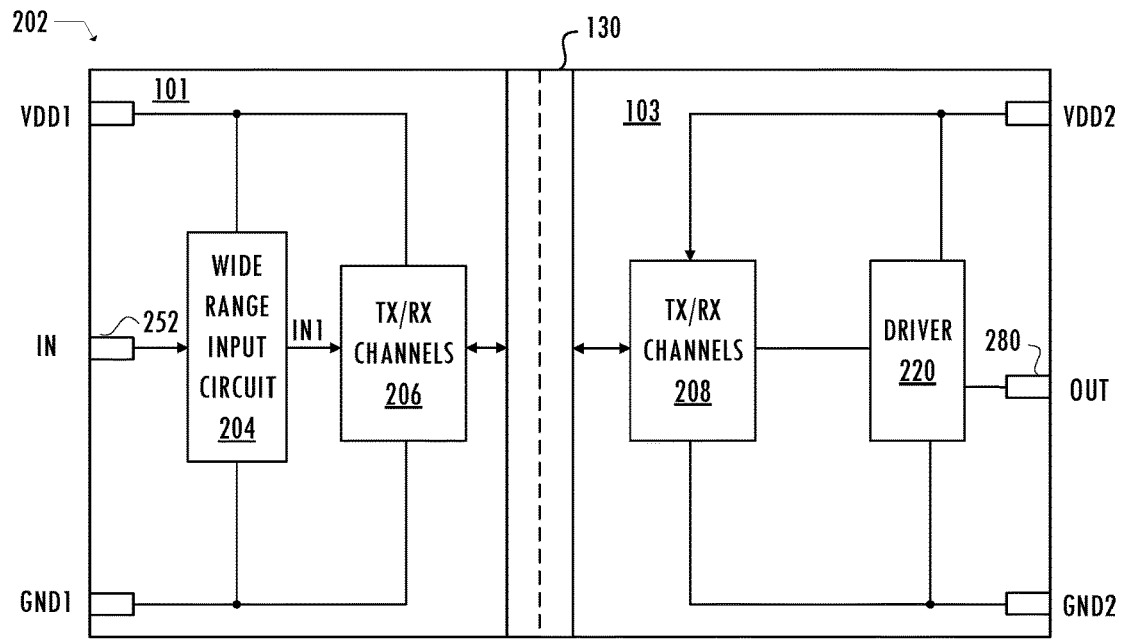
FIG. 3 illustrates an exemplary isolated driver integrated circuit including a wide range input circuit consistent with at least one embodiment of the invention.

Referring to FIG. 3, a technique for handling a wide range of voltage levels on an input terminal with reduced or no input current requirement includes wide range input circuit 204, which receives an input signal from terminal 252. Wide range input circuit 204 provides a substantially capacitive input impedance, thus drawing, at most, a negligible DC input current through input terminal 252 for a wide range of input voltage levels. For example, wide range input circuit 204 provides a received input signal IN1 having a high voltage level of approximately 2.5 V in response to an input voltage having a level from approximately 0 V to at least approximately 10 V and with an input current having a magnitude on the order of, at most, micro-Amps (μA).

Wide range input circuit 204 provides received input signal IN1 to internal circuitry, e.g., transmit/receive channels 206 of primary side 101, which operates using VDD1 (e.g., less than five volts) for communication across isolation channel 130 to circuitry operating using another voltage domain, e.g., transmit/receive channels 208 and driver 220 of secondary side 103, which operates using VDD2 (e.g., at least ten volts). Isolation channel 130 isolates the voltage domains of primary side 101 and secondary side 103, and also facilitates communication between primary side 101 and secondary side 103. Any suitable communication technique that does not use a conductive path between the two sides may be used, e.g., optical, capacitive, inductive, or electromagnetic techniques. An exemplary isolation channel is described in U.S. Provisional Application No. 61/872,537, entitled "Transport of an Analog Signal Across an Isolation Barrier," filed on Aug. 30, 2013, naming Jeffrey L. Sonntag, Douglas R. Frey, and Michael J. Mills as inventors, which application is hereby incorporated by reference.

In an embodiment of a control system, isolation channel 130 of isolation driver 202 facilitates communication of a control signal received by primary side 101 from controller 104 to secondary side 103, which may include a driver that generates an output control signal based on the received control signal received from the primary side and provides it to the output terminal OUT. In an exemplary embodiment, isolation driver 202 includes multiple integrated circuits configured as a multi-chip module in a single package. For example, isolated driver 202 includes a first integrated circuit operating using the first voltage domain to implement the primary side and another integrated circuit operating using the second voltage domain to implement the secondary side. In such embodiments, terminals 252 and 280 are pins of a package of the multi-chip module coupled to external elements.

Figure 4:
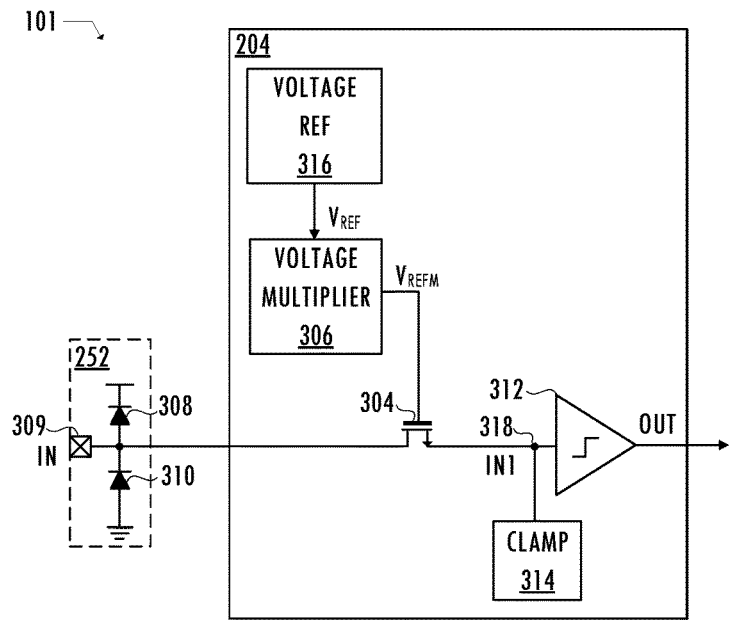
FIG. 4 illustrates an exemplary wide range input circuit consistent with at least one embodiment of the invention.

Referring to FIG. 4, in at least one embodiment, terminal 252 includes pad structure 309 and electrostatic discharge circuitry (e.g., diodes 308 and 310). Wide range input circuit 204 receives input signal IN from pad structure 309. Wide range input circuit 204 includes a laterally diffused metal-oxide semiconductor (LDMOS) field effect transistor, which has a high drain-to-source breakdown voltage capable of handling large drain-to-source voltages (i.e., $V_{DS}$, e.g., $V_{DS}$ greater than 10 V) and a low on resistance (i.e., $R_{ON}$, e.g., $R_{ON}$ less than 5 Ohms). In general, LDMOS transistors are used in microwave or radio frequency (RF) power amplifiers or high voltage switching applications. They may be fabricated by creating a diffused p-type channel region in a low-doped, n-type drain region on p/p+ silicon epitaxial layers using various ion-implantation and subsequent annealing cycles. Low doping in the drain region results in a large depletion layer with a high blocking voltage. Although the transistor may be fabricated using diffusion, the dopants may instead be implanted and annealed. In general, the LDMOS device is asymmetric. In at least one embodiment, transistor 304 is a high voltage LDMOS n-type transistor, which is available in an exemplary manufacturing process for mixed-signal integrated circuits. However, other transistor types that can sustain large drain-to-source voltages (e.g., conventional 5 V complementary metal-oxide semiconductor field-effect transistors, p-type metal-oxide semiconductor field-effect transistors, junction gate field-effect transistors (JFETs), or high-voltage bipolar transistors) may be used but may restrict allowable voltage levels at the input. Note that wide range input circuit 204 includes other types of transistors (e.g., conventional 5 V CMOS transistors in voltage reference 316 and voltage multiplier 306).

Transistor 304 receives a reference voltage signal on its gate terminal (e.g., reference voltage $V_{REFM}$, which may be a DC voltage having a negligible ripple voltage) that establishes a gate-to-source voltage ($V_{GS}$) of transistor 304 that is greater than a threshold voltage of transistor 304 ($V_{GS}>V_{th}$), forming a conductive path (e.g., conductive channel of a field-effect transistor) between the drain terminal and the source terminal of transistor 304. The reference voltage signal is generated based on another reference voltage (reference voltage $V_{REF}$) provided by voltage reference 316. In at least one embodiment, reference voltage $V_{REF}$ is stable with respect to variations in process, voltage supply, and temperature. For example, voltage reference 316 may include a bandgap reference circuit that generates a reference voltage of 1.2 V. In at least one embodiment, voltage multiplier 306 is charge pump-based and increases the reference voltage from 1.2 V to 3.4 V (e.g., multiplies the reference voltage by a factor of greater than two) and provides a 3.4 V voltage to the gate of transistor 304. The charge pump circuit receives $V_{REF}$ from voltage reference 316, multiplies that DC voltage, and supplies the resulting stable voltage to the gate of transistor 304. Use of the charge pump decouples any inner regulator circuitry from a power supply supplying the voltage $V_{DD}$ and thus, achieves improved power supply noise rejection. The charge pump operates using a clock signal, thus producing only synchronous noise, and provides reference voltage $V_{REFM}$, which is stable with respect to variations in process, voltage supply, and temperature.

Figure 6:
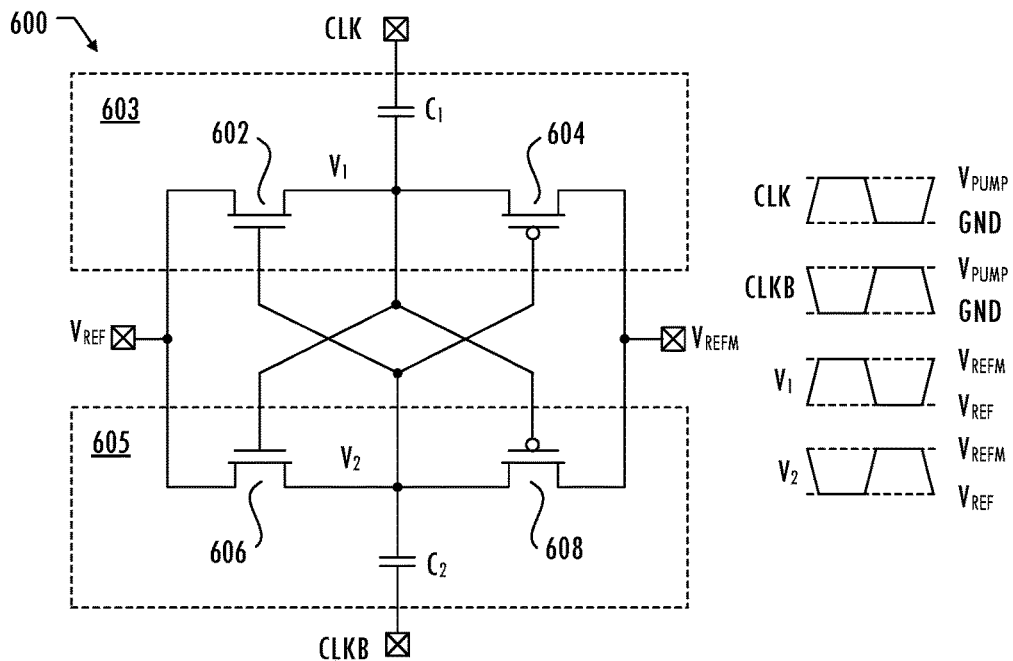
FIG. 6 illustrates a circuit diagram of a conventional latch-based charge pump stage and associated signal waveforms.

For example, referring to FIG. 6, latch-based charge pump 600 boosts control clock CLK to generate level-shifted clock $V_1$, which is used to control devices 602 and 604. Similarly, latch-based charge pump stage 600 boosts control clock CLKB to generate level-shifted clock $V_2$, which is used to control devices 606, and 608. Level-shifted clocks $V_1$ and $V_2$ oscillate between the voltage levels on the input node, $V_{REF}$ and the voltage level on the output node, $V_{REFM}$, where $V_{REFM}$ is a boosted version of $V_{REF}$. That is, $V_{REFM}=V_{REF}+V_{PUMP}$. A typical voltage level of $V_{PUMP}$ is the voltage level of an on-chip regulated power supply (e.g., $V_{DD}$). Latch-based charge pump 600 is a double charge pump stage, i.e., it includes independent charge pump branches 603 and 605 that are coupled to the same input and output nodes. Since the two phases of the control clock signal, CLK and CLKB, are out-of-phase, level-shifted clocks $V_1$ and $V_2$ are also out-of-phase, resulting in branches 603 and 605 alternating pumping the output voltage level to a pumped voltage level, e.g., to a voltage level of approximately $V_{REF}+V_{PUMP}$. The charge pump of FIG. 6 is exemplary only and other charge pump or voltage multiplier topologies may be used to generate the multiplied reference voltage (i.e., $V_{REFM}$, e.g., approximately 4 V) provided to the gate of a pass transistor.

Referring back to FIG. 4, transistor 304 operates in the linear region of transistor operation for drain-to-source voltages i.e., $V_{DS}<V_{GS}-V_{th}$ (e.g., $V_{DS}<$approximately 3 V) and linearly transfers the input signal IN to node 318. When $V_{GS}>V_{th}$ and $V_{DS}\geq(V_{GS}-V_{th})$, transistor 304 operates in saturation mode and the conductive channel exhibits pinching near the drain terminal, which limits the transfer of the voltage level of input signal IN to node 318 to $V_{GS}-V_{th}$ (e.g., 3.4 V). By receiving the input signal IN on the drain terminal of transistor 304, transistor 304 limits the voltage received on node 318, and draws, at most, negligible DC current (e.g., DC current on the order of micro Amps (uA) or less).

Clamp circuit 314, which may include one or more diode coupled conventional n-type transistors coupled in series to ground, prevents the signal on node 318 from drifting too high and maintains a voltage on node 318 at a level that will not damage slicer circuit 312, e.g., 3.4 V. Slicer circuit 312 may include a comparator that provides a low-distortion, low-noise output signal having a high voltage level (e.g., a 2 V signal) if the voltage on node 318 is above a first predetermined voltage. Slicer circuit 312 provides a low voltage level if the voltage on node 318 is below a second predetermined voltage, which may be the same as the first predetermined voltage or different from the first predetermined voltage, if hysteresis is implemented. In at least one embodiment, slicer circuit 312 implements hysteresis by including a circuit that selects between the first predetermined voltage level and the second predetermined voltage level based on the level of the output of slicer circuit 312 (e.g., using a multiplexer or other select circuit controlled by output signal OUT).

Figure 5A:
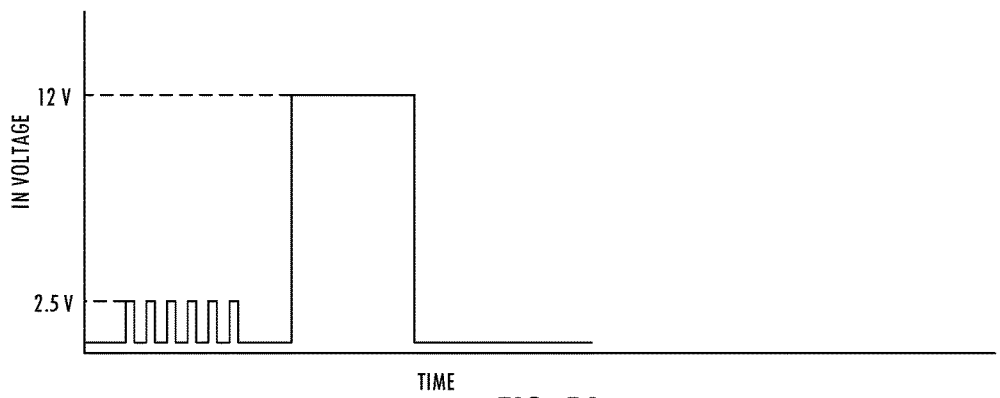
FIG. 5A illustrates an exemplary waveform for an input signal of the wide range input circuit of FIG. 4.
Figure 5B:
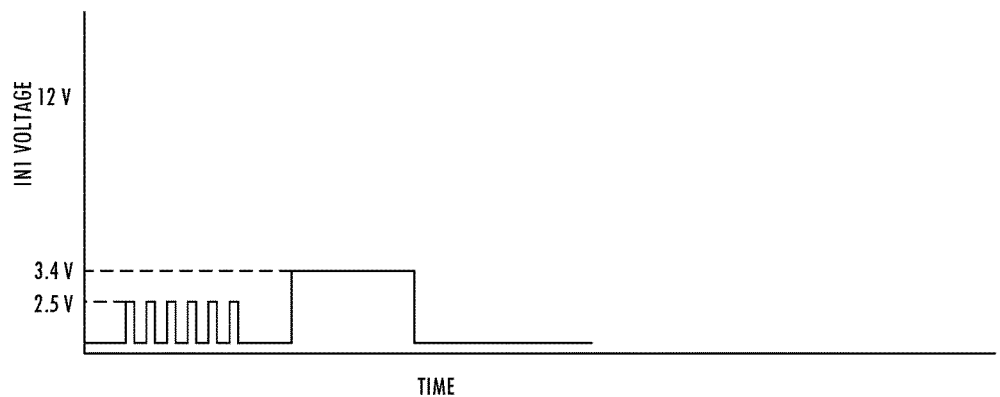
FIG. 5B illustrates an exemplary waveform for a received input signal provided by the wide range input circuit of FIG. 4 in response to the input signal of FIG. 5A.

Referring to FIGS. 4, 5A and 5B, in operation, reference voltage $V_{REFM}$ on the gate terminal of transistor 304 is a stable voltage that creates a conductive channel in transistor 304 ($V_{GS}>V_{th}$), and the voltage on terminal 309 causes $V_{DS}<V_{GS}-V_{th}$ (e.g., input signal IN is a digital signal having voltages less than approximately 3 V). Wide range input circuit 204 provides received input signal IN1 that is linearly related to input signal IN received from terminal 309 (e.g., received input signal IN1 has voltages less than approximately 3 V). However, when the voltage on the gate of transistor 304 is a stable voltage that causes $V_{GS}>V_{th}$, and the voltage on terminal 252 causes $V_{DS}\geq V_{GS}-V_{th}$ (e.g., input signal IN is an analog signal having a voltage level of at least approximately 4 V), wide range input circuit 204 provides a received input signal IN1 that is limited to a predetermined voltage level (e.g., received input signal IN1 that is approximately 3.4 V). Slicer circuit 312 then provides a distortion-free output signal (i.e., an output signal having a pulse width that is substantially the same as the pulse width of the input signal) that has voltage levels in the range of 0 V and VDD1 (e.g., where 2.5 V≤VDD1≤3.4 V), which may then be safely processed by other circuitry (e.g., transmit/receive channels 206 of FIG. 3).

In at least one embodiment, wide range input circuit 204 introduces at most negligible loading, distortion, and delay. For example, the delay through transistor 304 and the delay through slicer circuit 312 is less than the delay through a DC-DC converter 106 or other voltage regulation circuitry. Exemplary on-resistance of transistor 304 of FIG. 4 is approximately 5 Ohms and the input capacitive loading is on the order of hundreds of femtofarads. Therefore, the delay is typically under 500 femtoseconds. In clamp implementations described above, the input capacitive loading is a function of the input load and can increase both delays and distortion due to large capacitance changes. Exemplary clamp implementations can have capacitive changes on the order of picofarads. In addition, the rising and falling edges of signal IN1 are approximately equal, and associated pulse distortion (i.e., ABS(Tphl−Tplh), where Tphl is the falling-edge delay and Tplh is the rising-edge delay) is negligible.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

Figure 7:
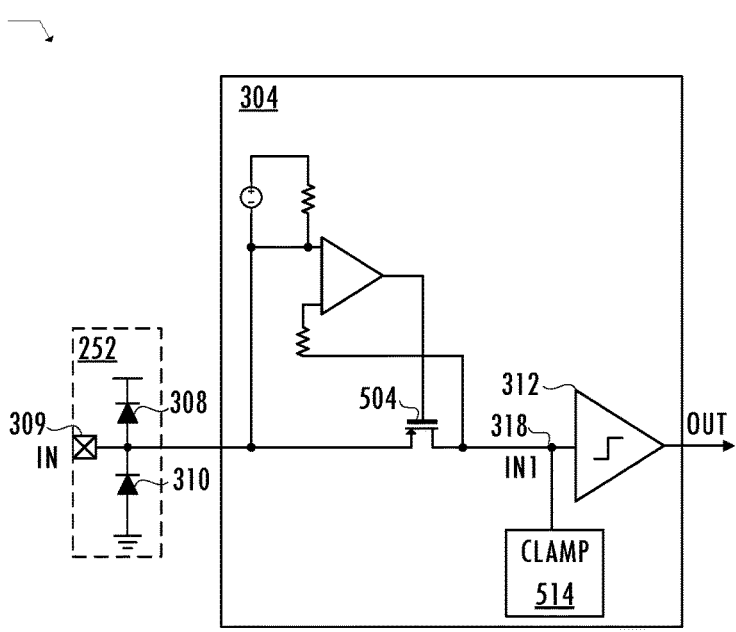
FIG. 7 illustrates an exemplary wide range input circuit that is complementary to the wide range input circuit of FIG. 4 consistent with at least one embodiment of the invention.

The description of the invention set forth herein is illustrative, and is not intended to limit the scope of the invention as set forth in the following claims. For example, while the invention has been described in embodiments in which the pass device is an n-type LDMOS transistor, one of skill in the art will appreciate that the teachings herein can be utilized with one or more other pass transistors of other types (e.g., p-type transistor 504 and associated voltage reference generation circuitry and clamp circuit 514 of wide range input circuit 304, as illustrated in FIG. 7, a JFET pass transistor, bipolar pass transistor, or other high voltage pass transistor with a stable control voltage configured as a voltage limiter). Variations and modifications of the embodiments disclosed herein, may be made based on the description set forth herein, without departing from the scope of the invention as set forth in the following claims.

What is claimed is:

1. An integrated circuit comprising:
   an input terminal configured to receive an input signal;
   a reference voltage node configured to provide a control voltage; and
   a pass transistor comprising a first terminal coupled to a first node, a control terminal coupled to the reference voltage node, and a second terminal coupled to the input terminal, the control voltage having a control voltage level sufficient to allow a signal to pass from the second terminal to the first terminal;
   wherein the pass transistor is configured to linearly transfer the input signal to the first node in response to a voltage level of the input signal being below a first voltage level and configured to transfer a voltage-limited version of the input signal to the first node in response to the voltage level being above the first voltage level, and
   wherein the pass transistor is a laterally diffused metal-oxide-semiconductor field-effect transistor having a high drain-to-source breakdown voltage, the first terminal is a source terminal, the second terminal is a drain terminal, and the control terminal is a gate terminal.

2. The integrated circuit, as recited in claim 1, wherein the input signal being below the first voltage level causes a drain-to-source voltage of the pass transistor to be less than a difference between a gate-to-source voltage of the pass transistor and a threshold voltage of the pass transistor and the input signal being above the first voltage level causes the drain-to-source voltage of the pass transistor to be greater than the difference between the gate-to-source voltage of the pass transistor and the threshold voltage of the pass transistor.

3. The integrated circuit, as recited in claim 1, wherein the pass transistor provides a capacitive load to the input terminal, and
   wherein in operation, at most a negligible DC current flows through the input terminal into the second terminal.

4. The integrated circuit, as recited in claim 1, further comprising:
   electrostatic discharge protection circuitry coupled to the input terminal and the second terminal,
   wherein the input terminal comprises a pad structure.

5. The integrated circuit, as recited in claim 1, wherein the input signal is a digital signal having voltage levels in a range of 0 V to 2 V and a second voltage level on the first node is at most a difference between the control voltage and a threshold voltage of the pass transistor.

6. The integrated circuit, as recited in claim 1, wherein the input signal is an analog signal having voltage levels in a range of 0 V to at least 10 V and a second voltage level on the first node is at most a difference between the control voltage and a threshold voltage of the pass transistor.

7. The integrated circuit, as recited in claim 1, wherein a signal on the first node has a peak voltage level that is at least an order of magnitude less than a maximum allowable voltage level on the input terminal and the control voltage has a control voltage level that is at least an order of magnitude less than the maximum allowable voltage level on the input terminal.

8. The integrated circuit, as recited in claim 1, further comprising:
   a clamp circuit configured to limit a second voltage level of a signal on the first node; and
   a comparator circuit configured to provide an output signal having a third voltage level in response to the second voltage level being greater than a predetermined voltage level and configured to provide the output signal having a fourth level in response to the second voltage level of the signal being less than the predetermined voltage level.

9. The integrated circuit, as recited in claim 8, wherein the second voltage level is an order of magnitude less than a maximum allowable voltage level of the input signal.

10. The integrated circuit, as recited in claim 1, further comprising:
a reference voltage generator configured to generate a first reference voltage having a first DC voltage level that is substantially insensitive to process, power supply voltage, and temperature variations; and
a charge pump configured to boost the first reference voltage to generate the control voltage having a substantially stable DC voltage level that is substantially insensitive to process, power supply voltage, and temperature variations.

11. A method for receiving an input signal by an integrated circuit comprising:
establishing a conductive path between a first terminal of a pass transistor and a second terminal of the pass transistor by applying a control voltage to a control terminal of the pass transistor;
linearly transferring the input signal from an input terminal of the integrated circuit to a first node through the second terminal to the first terminal via the conductive path in response to the input signal having a voltage level below a first voltage level and transferring a voltage-limited version of the input signal to the first node through the conductive path in response to the input signal having a voltage level above the first voltage level;
limiting a second voltage level of a signal on the first node; and
providing an output signal having a third voltage level in response to the second voltage level being greater than a predetermined voltage level and configured to provide the output signal having a fourth level in response to the second voltage level of the signal being less than the predetermined voltage level.

12. The method, as recited in claim 11,
wherein the pass transistor provides a capacitive load to the input terminal, and
wherein in operation, at most a negligible DC current flows through the input terminal into the second terminal.

13. The method, as recited in claim 11, wherein the pass transistor is a laterally diffused metal-oxide-semiconductor field-effect transistor having a high drain-to-source breakdown voltage, the first terminal is a source terminal, the second terminal is a drain terminal, and the control terminal is a gate terminal.

14. The method, as recited in claim 11, further comprising:
receiving as the input signal, a digital signal having voltage levels in a range of 0 V to 2 V and the second voltage level of the signal on the first node is at most a difference between the control voltage and a threshold voltage of the pass transistor, the pass transistor being a field effect transistor, the first terminal being a source terminal, the second terminal being a drain terminal, and the control terminal being a gate terminal.

15. The method, as recited in claim 11, further comprising:
receiving as the input signal, an analog signal having voltage levels in a range of 0 V to at least 10 V and a second voltage level on the first node is at most a difference between the control voltage and a threshold voltage of the pass transistor, the pass transistor being a field effect transistor, the first terminal being a source terminal, the second terminal being a drain terminal, and the control terminal being a gate terminal.

16. The method, as recited in claim 11, wherein a signal on the first node has a peak voltage level that is at least an order of magnitude less than a maximum allowable voltage level on the input terminal and the control voltage has a control voltage level that is at least an order of magnitude less than the maximum allowable voltage level on the input terminal.

17. The method, as recited in claim 11, further comprising:
selecting one of a first predetermined voltage level and a second predetermined voltage level as the predetermined voltage level in response to the output signal.

18. An apparatus comprising:
means for generating a control signal having a DC voltage level; and
means for receiving an input signal having voltage level in a range of 0 V to at least 10 V and for presenting a version of the input signal having voltage levels in a second range of 0 V and 4 V in response to the control signal while drawing at most a negligible DC current.

* * * * *